(12) United States Patent
Suzuki et al.

(10) Patent No.: US 6,597,625 B2
(45) Date of Patent: Jul. 22, 2003

(54) SEMICONDUCTOR MEMORY DEVICE

(75) Inventors: Takanobu Suzuki, Tokyo (JP); Takeshi Hamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/976,113

(22) Filed: Oct. 15, 2001

(65) Prior Publication Data

US 2003/0072207 A1 Apr. 17, 2003

(51) Int. Cl.[7] .............................. G11C 8/00; G11C 7/00
(52) U.S. Cl. ................ 365/230.08; 365/63; 365/189.05
(58) Field of Search ...................... 365/230.08, 230.03, 365/63, 189.05

(56) References Cited

U.S. PATENT DOCUMENTS 6,067,260 A * 5/2000 Ooishi et al. ................ 365/200
6,480,439 B2 * 11/2002 Tokutome et al. ........... 365/233

FOREIGN PATENT DOCUMENTS

JP 2000-174210 6/2000

* cited by examiner

*Primary Examiner*—Son T. Dinh
(74) *Attorney, Agent, or Firm*—McDermott, Will & Emery

(57) ABSTRACT

A semiconductor memory device wherein, if an address-input buffer section 3 is arranged away from a central part of a memory chip 8, then a second address-latch circuit section 5 is arranged at a neighborhood of the address-input buffer section 3. By this means, the deterioration of the setup/hold characteristics in the address data IA[0–12] of the internal address signal due to coupling noise between wiring lines and the like can be prevented. A first address-latch circuit section 4 is arranged at a central part of the memory chip 8, so that delays in a bank-control signal for memory banks 2a to 2d and the like can be prevented. Further, if the address-input buffer section 3 is divided into a plurality of address-input buffers, for example, two buffers 3a and 3b, and arranged on the memory chip 8, then the second address-latch circuit section 5 is also divided into two address-latch circuits 5a and 5b, corresponding to the address-input buffers 3a and 3b, and the address-latch circuit 5a is arranged at a neighborhood of the address-input buffer 3a, and the address-latch circuit 5b is arranged at a neighborhood of the address-input buffer 3b.

5 Claims, 6 Drawing Sheets

SEMICONDUCTOR MEMORY DEVICE

BACKGROUND OF THE INVENTION

1. Field of the Invention

The present invention relates to a semiconductor memory device that has a plurality of memory-cell arrays composed of a DRAM or the like within a memory chip, and particularly relates to an address-system circuit within the memory chip.

2. Description of the Related Art

Conventionally, in a semiconductor memory device of the bank switching method wherein a plurality of memory banks are built into a memory chip and used by switching, an address-latch circuit section that latches address data input from the outside to output the latched address data into each memory bank has been collectively arranged at a central part of the memory.

FIG. 5 is a schematic block diagram that illustrates an exemplary construction of such a semiconductor memory device of the bank switching method and shows an example of arranging the components within a memory chip. In FIG. 5, the case where 4 memory banks are owned is shown as an example.

In FIG. 5, an address signal (hereafter called external address signal) EADD input from an external system device 110, which controls the operation of a semiconductor memory device 100, is input to an address-input buffer section 101. An internal address signal IADD is generated in the address-input buffer section 101. The output internal address signal IADD is latched in an address-latch circuit section 102 and output to each memory bank 103 to 106 from that address-latch circuit section 102 as an address-latch signal ADDL.

In the following, an example is described, in which the address signals are composed as follows. The external address signal EADD is composed of 15-bit address data consisting of 2-bit bank-address data EBA[0–1] and the subsequent 13-bit address data EA[0–12]. The internal address signal IADD is composed of 15-bit address data consisting of 2-bit bank-address data IBA[0–1] and the subsequent 13-bit address data IA[0–12]. Further, in the example, the address-latch signal ADDL is composed of 15-bit address data consisting of 2-bit bank-address data BAL[0–1] and the subsequent 13-bit address data AL[0–12].

The [0–12] in the address data EA[0–12], IA[0–12], and AL[0–12] indicates a 13-bit data unit consisting of the 0th to 12th bits, and similarly, [0–1] in the bank-address data EBA[0–1], IBA[0–1], and BAL[0–1] indicates a 2-bit data unit consisting of the 0th to 1st bits.

As shown in FIG. 5, conventionally, the address-latch circuit section 102 has been arranged at a central part of a memory chip 107. However, if the address-input buffer section 101 is arranged away from a central part of the memory chip 107, wiring for transmitting the internal address signal IADD from the address-input buffer section 101 to the address-latch circuit section 102 becomes long, so that there has been a case where the setup/hold characteristics for addresses become worse owing to coupling noise between the wiring lines and the like.

On the other hand, FIG. 6 shows the wiring lines on which the internal address signal IADD is transmitted, i.e., signal lines SL0 to SL14 on which the corresponding bits of the bank-address data IBA[0–1] and address data IA[0–12] are respectively transmitted. FIG. 6 also shows parasitic capacitance formed between each pair of adjacent signal lines. Paying attention to the signal line SL1 on which the address bit data IA[1] is transmitted in FIG. 6, we now describe the setup/hold characteristics of addresses, referring to the timing chart in FIG. 7.

The setup/hold time for addresses is the setup/hold time for the external address signal EADD corresponding to an external clock signal ECLK. In the semiconductor memory device 100, the setup/hold time for addresses is determined by the timing of internal address signal IAD from the address-input buffer section 101 and rises in an internal clock ICLK.

First, the case where the address bit data IA[1] changes from low level to high level is explained. In this case, the address bit data IA[0] and IA[2] on the signal lines SL0 and SL2 adjacent to the signal line SL1, i.e., the address data IA[0,2], can be at the three transient states: state a of no change, rising state b from low to high level, and falling state c from high to low level. We now describe the setup/hold characteristics of the address data IA[1] at the b and c state on the basis of the a state.

In FIG. 7, the address data IA[1] and IA[0,2] at the a state are respectively indicated by IA[1]a and IA[0,2]a. Similarly, the address data IA[1] and IA[0,2] at the b state are respectively indicated by IA[1]b and IA[0,2]b, and the address data IA[1] and IA[0,2] at the c state are respectively indicated by IA[1]c and IA[0,2]c. Also, in FIG. 7, the setup time tS and the hold time tH at the a state are respectively indicated by tSa and tHa, the setup time tS and the hold time tH at the b state are respectively indicated by tSb and tHb, and the setup time tS and the hold time tH at the c state are respectively indicated by tSc and tHc.

At the b state, the address data IA[1] and IA[0,2] vary with the same phase. Therefore, coupling noise between wiring lines, i.e. interference by signals on adjacent lines through parasitic capacitance formed between wiring lines occurs, so that the address data IA[1] rises faster than at the a state.

Next, at the c state, the address data IA[0,2] varies with a phase inverse to that of IA[1]. Therefore, coupling noise between wiring lines occurs, so that the address data IA[1] rises slower than at the a state.

Now, we compare the effects of the b state and the c state on the address data IA[1]. The setup time tS and the hold time tH for the address data EA[1], which is the first bit data of the external address signal EADD, corresponding to the external clock signal ECLK, are the same. However, the setup time and hold time corresponding to the internal clock signal ICLK in the address-latch circuit section 102, which determine the setup/hold characteristics for the addresses, become different. Therefore, the setup time and hold time for addresses become dispersed corresponding to the changes in the address data of the adjacent signal lines.

In this way, if the signal lines SL0 to SL14 on which the internal address signal IADD is transmitted become longer, setup time and hold time for addresses become dispersed by coupling noise between adjacent signal lines, so that there have been cases where the setup/hold characteristics for addresses deteriorate.

SUMMARY OF THE INVENTION

The object of the present invention is to solve the aforementioned problem and to provide a semiconductor memory device that can reduce the dispersion of setup time and hold time for addresses due to coupling noise and can improve the setup/hold characteristics for addresses by arranging the address-latch circuit section on the memory chip so that wiring between the input buffer section and the address-latch circuit section becomes short.

A semiconductor memory in accordance with the present invention is equipped with a memory section that is composed of a plurality of memory banks, an address-input buffer section that generates and outputs an internal address signal corresponding to an external address signal, which is an address signal input from the outside, a first address-latch circuit section that latches data indicative of a desired memory bank contained in the internal address signal output from the address-input buffer section to output to each memory bank of the above memory section, and a second address-latch circuit section that latches data indicative of a cell address contained in the internal address signal output from the address-input buffer section to output to each memory bank of the above memory section, the second address-latch circuit section being arranged at a neighborhood of the address-input buffer section. In this way, the second address-latch circuit section is arranged at a neighborhood of the address-input buffer section, so that the effects of coupling noise between the wiring lines on which corresponding predetermined address data of the internal address signal are transmitted can be reduced. Therefore, the dispersion of setup time and hold time for addresses is reduced, and the setup/hold characteristics for addresses can be improved.

The above first address-latch circuit section further latches data contained in the internal address signal that is used for generating commands for performing the operation control of each memory bank of the memory section, and outputs the latched address data into each memory bank of the memory. Therefore, delays in a control signal for each memory bank can be prevented.

Also, the address-input buffer section is arranged at a terminal part of the memory chip, and the first address-latch circuit section is arranged at a central part of the memory chip. By this means, wiring for transmitting predetermined address data in the internal address signal between the address-input buffer section and a central part of the memory chip becomes unnecessary, so that design efficiency in the pattern layout can be improved.

On the other hand, the address-input buffer section may be composed of a plurality of address-input buffers, and the second address-latch circuit section may be composed of a plurality of address-latch circuits respectively built corresponding to the address-input buffers, and each address-latch, circuit may be arranged at a neighborhood of the corresponding address-input buffer. By this means, when the address-input buffer section consists of a plurality of decentralized address-input buffers, the effects of coupling noise between the wiring lines on which predetermined address data in the internal address signal are transmitted can be reduced, and the dispersion of setup time and hold time for addresses can be reduced, so that the setup/hold characteristics for addresses can be improved.

Specifically, each address-input buffer generates and outputs address data, which is part of an internal address signal, depending on the corresponding address data in the input external address signal. Then each address-latch circuit latches predetermined address data in the input address signal output from the corresponding address-input buffer and outputs into each memory bank in the memory section. By this means, if the address-input buffer consists of a plurality of decentralized address-input buffers, delays in a control signal for each memory bank can be prevented.

Further, each address-input buffer may be arranged at a terminal part of the memory chip. By this means, if the address-input buffer section consists of a plurality of decentralized address-input buffers, wiring for transmitting predetermined address data in the internal address signal between each address-input buffer and a central part of the memory chip becomes unnecessary, so that design efficiency in the pattern layout can be improved.

BRIEF DESCRIPTION OF THE DRAWINGS

Various objects, characteristics, and advantages of the present invention will become apparent by the preferred embodiment described in the following with reference to the accompanying drawings, in which.

DESCRIPTION OF THE PREFERRED EMBODIMENT

In the following is described in detail the present embodiment illustrated in the figures.

Figure 1:
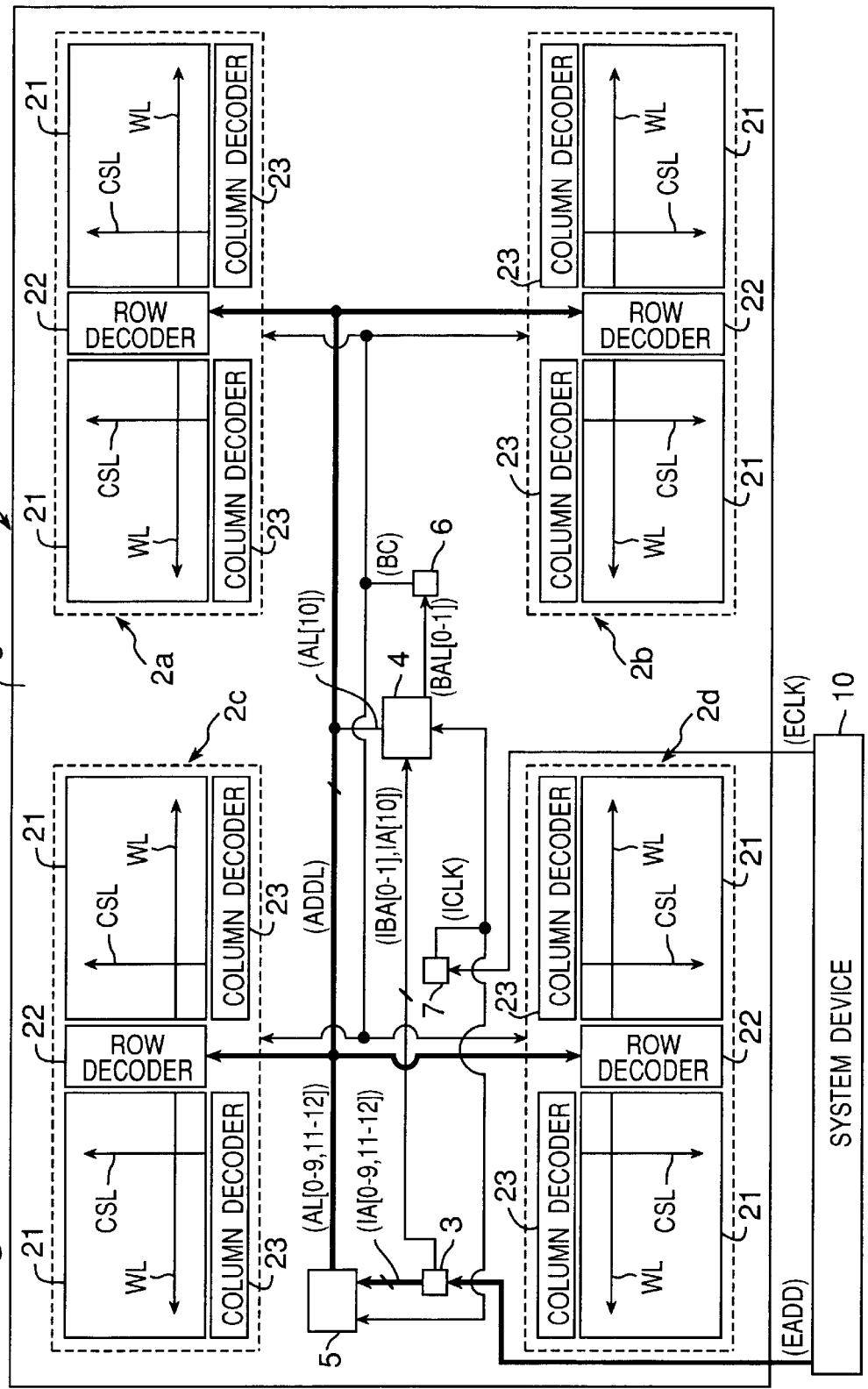
FIG. 1 is a schematic block diagram that illustrates an exemplary semiconductor memory device in an embodiment of the present invention.

FIG. 1 is a schematic block diagram that illustrates an exemplary semiconductor memory device in an embodiment of the present invention. Here, FIG. 1 shows a semiconductor memory device that is of the bank-switching method and has 4 memory banks.

The semiconductor memory device 1 in FIG. 1 is equipped with memory banks 2a to 2d, an address-input buffer section 3, a first address-latch circuit section 4, a second address-latch circuit section 5, a bank-control circuit section 6, and a clock-input buffer section 7. Here, the memory banks 2a to 2d constitute a memory section.

Each of the memory banks 2a to 2d has a memory-cell array 21 that consists in a memory cell such as a DRAM or the like, a row decoder 22 that selects a word line WL for the memory-cell array 21, and a column decoder 23 that selects a column-select line CSL for the memory-cell array 21.

The address-input buffer section 3 feeds an external address signal EADD from an external system device 10 that performs the operation control of the semiconductor memory device 1, and generates and outputs an internal address signal IADD depending on the external address signal EADD. If the external address signal EADD is composed of, for example, 15-bit address data consisting of 2-bit bank-address data EBA[0–1] and the subsequent 13-bit address data EA[0–12], then the address-input buffer section 3 generates an internal address signal IADD composed of 15-bit address data consisting of 2-bit bank-address data IBA[0–1] and the subsequent 13-bit address data IA[0–12].

The address-input buffer section 3 outputs, into the first address-latch circuit section 4, the generated bank-address data IBA[0–1] and the address data IA[10], which is the 10th bit data of the generated address data IA[0–12]. At the same time, the address-input buffer section 3 outputs, into the second address-latch circuit section 5, the address data IA[0–9,11–12], which consists of the 0th to 9th and the 11th to 12th bit data of the generated address data IA[0–12].

Here, the bank-address data IBA[0–1] indicates one memory bank that is exclusively activated in the four memory banks 2a to 2d. The address data IA[10] is a signal necessary for generating a command for controlling the internal operation of the selected memory bank.

The first address-latch circuit section 4 latches the input bank-address data IBA[0–1] to output into the bank-control circuit section 6 as the bank-address data BAL[0–1], and also latches the input address data IA[10] to output into the memory banks 2a to 2d as the address data AL[10] of the address-latch signal ADDL. The bank-control circuit section 6 decodes the input bank-address data BAL[0–1] and outputs a bank-control signal BC into each row decoder 22 and each column decoder 23 of the memory banks 2a to 2d, so that the row-decoder 22 and the column decoder 23 of an exclusively selected memory bank are activated.

On the other hand, the second address-latch circuit section 5 latches the input address data IA[0–9,11–12] to output into each row decoder 22 and each column decoder 23 of the memory banks 2a to 2d as the address data AL[0–9,11–12] of the address-latch signal ADDL.

Also, the external clock signal ECLK, which is a clock signal input from the outside, is input to the clock-input buffer section 7. The clock-input buffer section 7 generates the internal clock signal ICLK corresponding to the external clock signal ECLK to output into the first address-latch circuit section 4 and the second address-latch circuit section 5. The first address-latch circuit section 4 and the second address-latch circuit section 5 perform latch operation depending on the internal clock signal ICLK.

Figure 2:
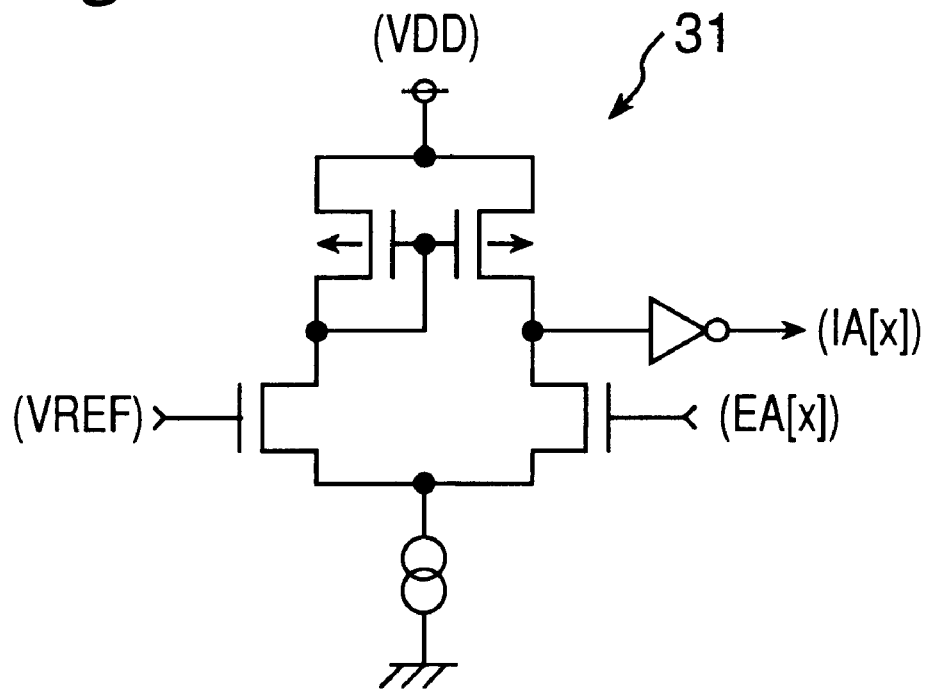
FIG. 2 is a drawing that illustrates an exemplary circuit of an address-input buffer for 1-bit data in the address-input buffer section 3 of FIG. 1.

FIG. 2 illustrates an exemplary circuit of an address-input buffer for 1-bit data in the address-input buffer section 3. The address-input buffer 31 in FIG. 2 forms a voltage comparator consisting in a differential amplifier and compares a predetermined reference voltage VREF with the address data EA[x], where x=0, . . . , 12. If the voltage of the address data EA[x] is greater than VREF, then the 1-bit address data IA[x] of the internal address signal IADD, which is the output signal, becomes high level (High). If the voltage of the address data EA[x] is less than VREF, then the 1-bit address data IA[x] becomes low level (Low).

Figure 3:
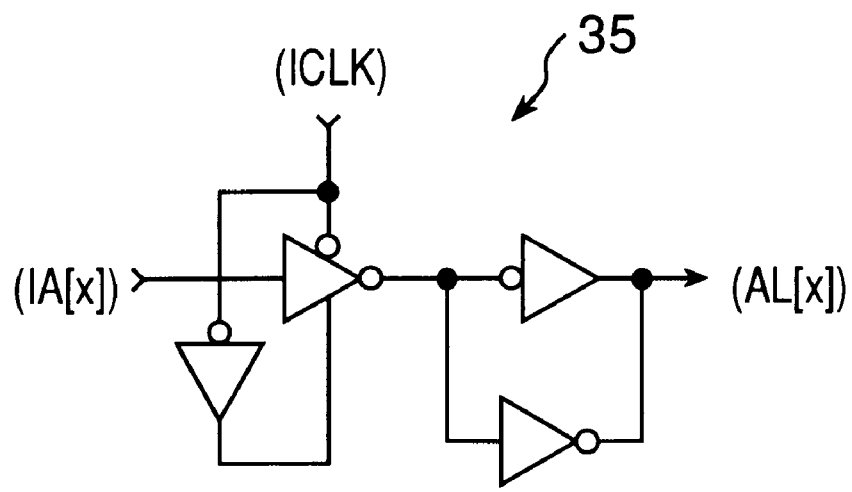
FIG. 3 is a drawing that illustrates an exemplary address-latch circuit for 1-bit data in the first address-latch circuit section 4 and the second address-latch circuit section 5 of FIG. 1.

Next, FIG. 3 illustrates an exemplary address-latch circuit for 1-bit data in the first address-latch circuit section 4 and the second address-latch circuit section 5. The address-latch circuit 35 in FIG. 3 latches the input address data IA[x] with rises in the internal clock signal ICLK to output as the 1-bit address data AL[x] in the address-latch signal ADDL.

In this construction, the second address-latch circuit section 5 is arranged at a neighborhood of the address-input buffer section 3, which is arranged at a terminal part of a memory chip 8. By this means, effects of coupling noise between the wiring lines on which the address data IA[0–9, 11–12] are correspondingly transmitted can be reduced, so that the dispersion of setup time and hold time for addresses is reduced, and the setup/hold characteristics for addresses can be improved. Further, wiring for transmitting the address data IA[0–9,11–12] in the internal address signal IADD between the address-input buffer section 3 and a central part of the memory chip 8 becomes unnecessary, so that pattern layout can become favorable.

On the other hand, the bank-control circuit section 6 is arranged at a central part of the memory chip 8. Delays in the address data IA[10] and the bank-address data IBA[0–1], which are necessary for generating commands for controlling the internal operation of the DRAM, are not desirable, since they influence the speed margin of direct operation. Therefore, the bank-control signal BC is required to be earlier input to the row decoder 22 and column decoder 23 in the memory banks 2a to 2d than the address-latch signal ADDL.

Therefore, if the first address-latch circuit section 4 is arranged at a central part of the memory chip 8, and generates and outputs therein the address-latch signal ADDL, then delays in the address-latch signal ADDL become short, and delays in generating the bank-control signal can be prevented.

In this way, if the address-input buffer section 3 is arranged away from a central part of the memory chip 8, the deterioration of setup/hold characteristics in the address data IA[0–12] of the internal address signal IADD due to coupling noise between wiring lines and the like can be prevented by arranging the second address-latch circuit 5 at a neighborhood of the address-input buffer section 3. By arranging the first address-latch circuit section 4 at a central part of the memory chip 8, delays in a control signal and the like for the memory banks 2a to 2d can be prevented.

Figure 4:
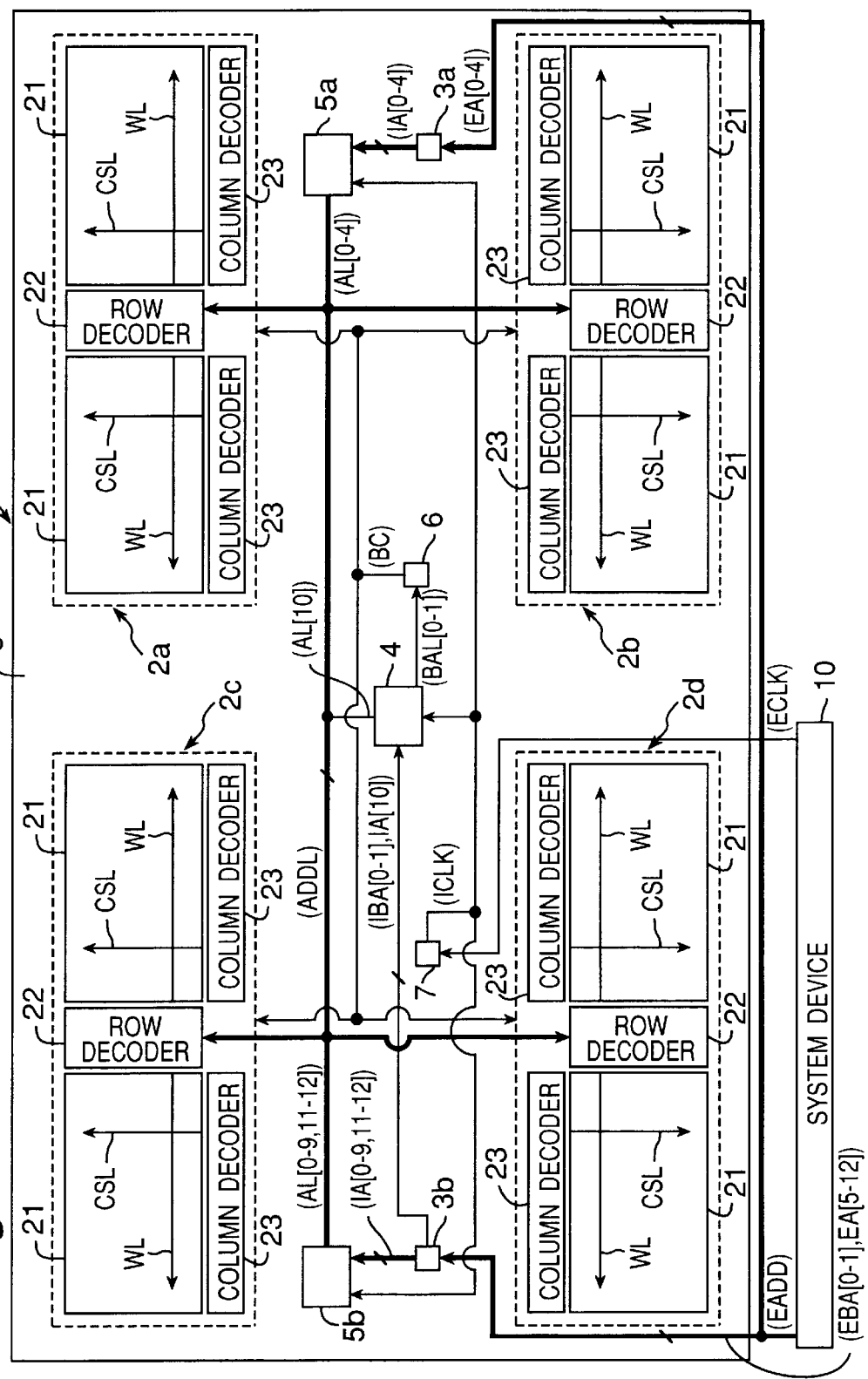
FIG. 4 is a schematic block diagram that illustrates a variant example of the semiconductor memory device in the embodiment of the present invention.
Figure 5:
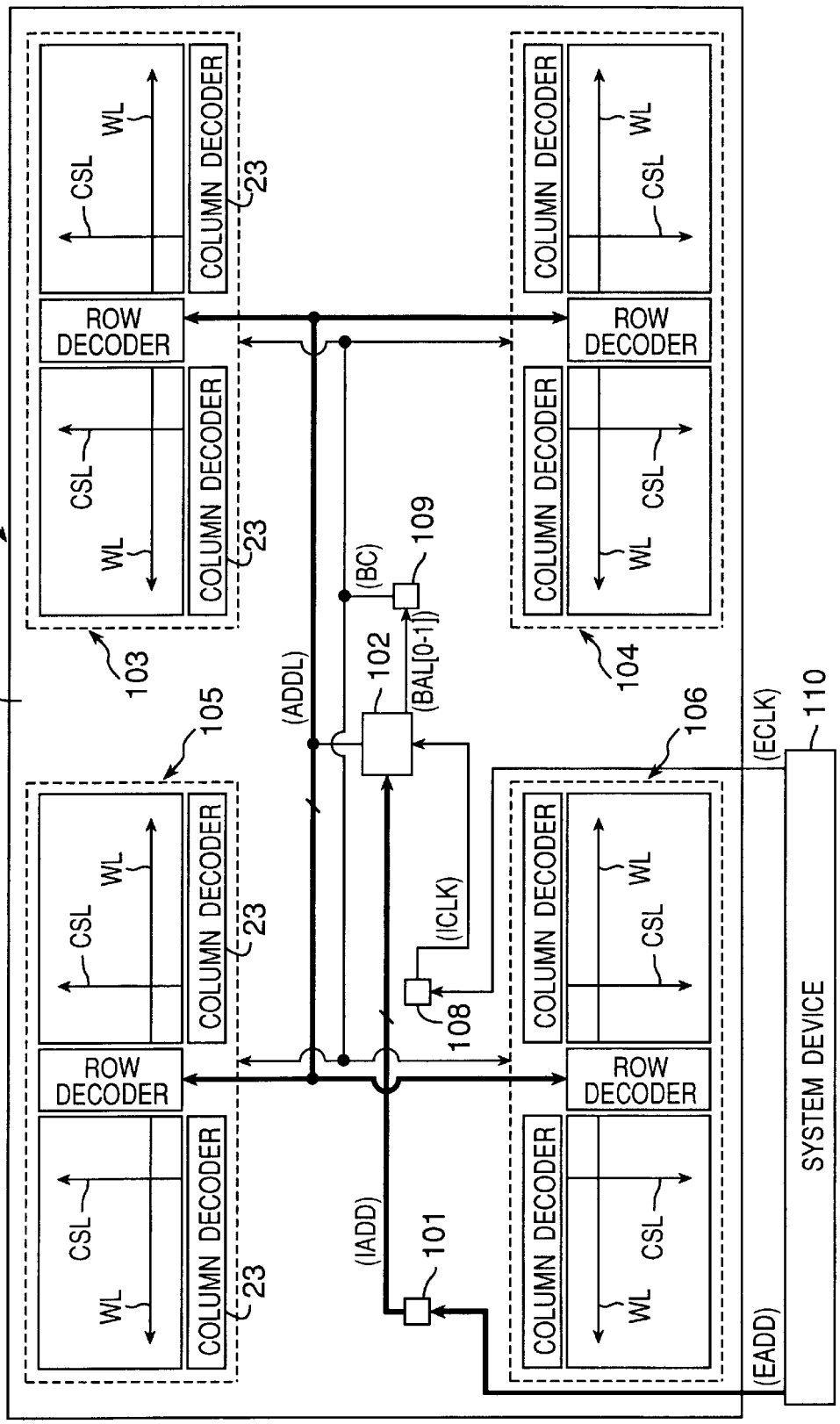
FIG. 5 is a schematic block diagram that illustrates an exemplary construction of a conventional semiconductor memory device.
Figure 6:
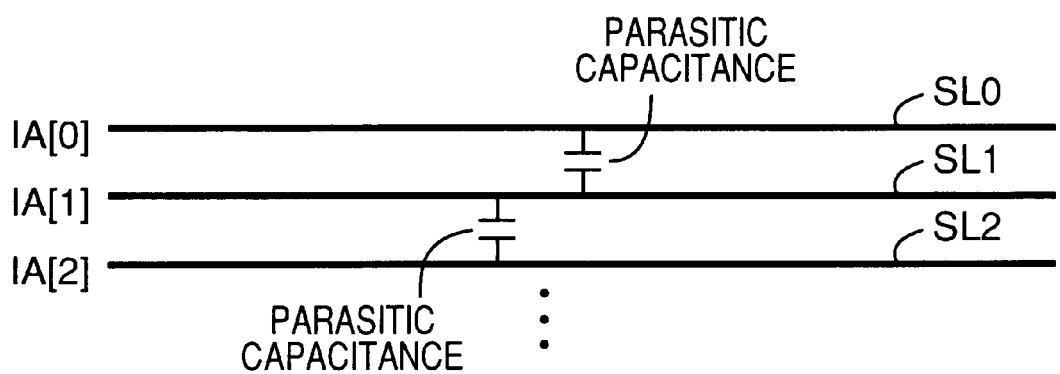
FIG. 6 is a drawing that illustrates a group of signal lines on which address data are transmitted.
Figure 7:
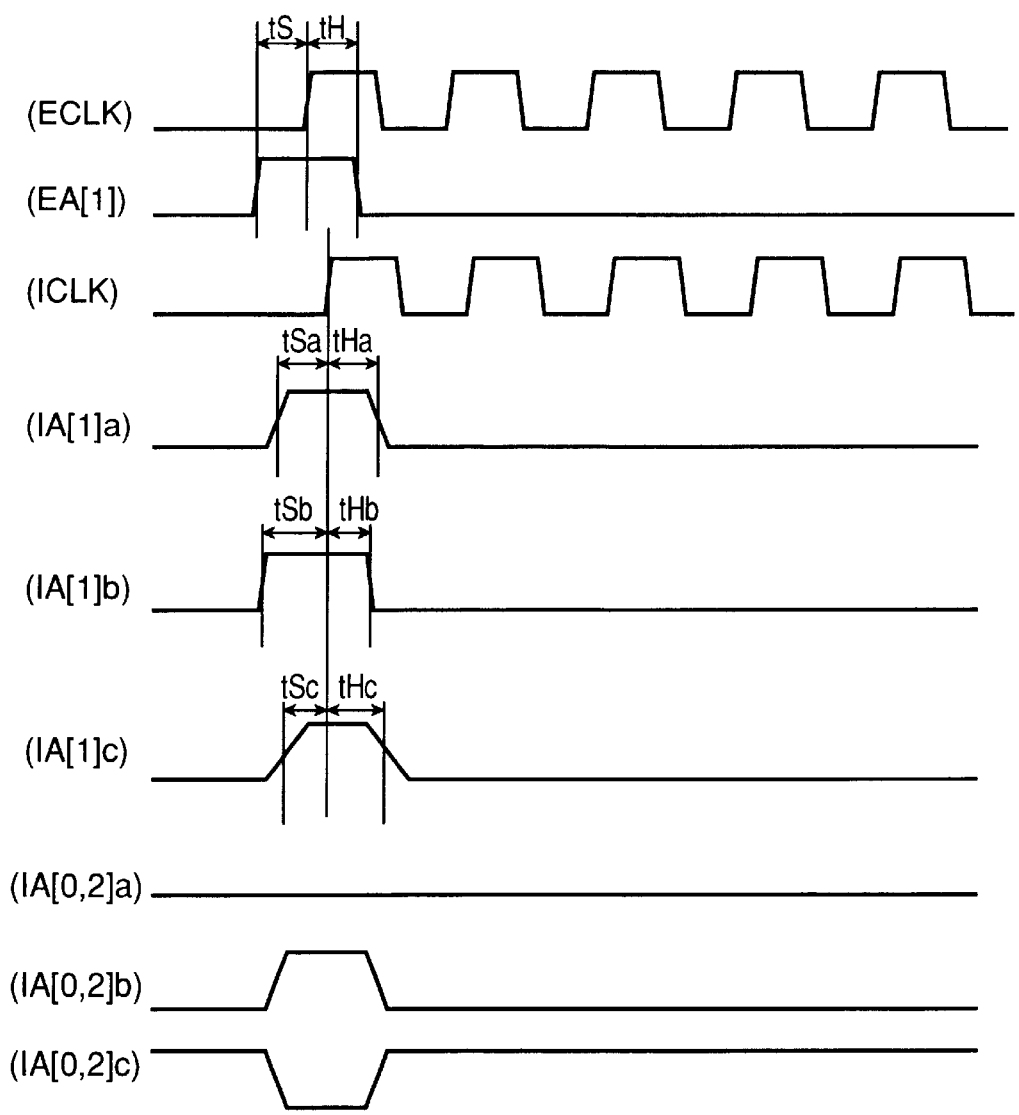
FIG. 7 is a timing chart that illustrates examples of waveforms of the signals in FIGS. 5 and 6.

If the address-input buffer section 3 is divided into a plurality of buffers, for example, an address-input buffer 3a and an address input buffer 3b as shown in FIG. 4, and arranged on the memory chip 8, then the second address-latch circuit section 5 may well be divided into address latch circuits 5a and 5b corresponding to the address-input buffers 3a and 3b. In this case, the address-latch circuit 5a is arranged at a neighborhood of the address input buffer 3a, and the address-latch circuit 5b is arranged at a neighborhood of the address input buffer 3b.

For example, in FIG. 4, the 5-bit address data EA[0–4] in the external address signal EADD is input to the address-input buffer 3a, and the address-input buffer 3a generates the 5-bit address data IA[0–4] in the internal address signal IADD corresponding to the address data EA[0–4] and outputs into the address-latch circuit 5a. The address-latch circuit 5a latches the input address data IA[0–4] to output respectively into the memory banks 2a to 2d as the address data AL[0–4] of the address-latch signal ADDL.

Similarly, the 2-bit bank-address data EBA[0–1] and the 8-bit address data EA[5–12] in the external address signal EADD are input to the address-input buffer 3b. The address-input buffer 3b generates the 2-bit bank-address data IBA[0–1] and the 8-bit address data IA[5–12] in the internal address signal IADD corresponding to the bank-address data EBA[0–1] and the address data EA[5–12] to output the address data IA[5–9,11–12] into the address-latch circuit 5b and to output the bank-address data IBA[0–1] and the address data IA[ 10] into the first address-latch circuit section 4. The address-latch circuit 5b latches the input address data IA[5–9,11–12] to output respectively into the memory banks 2a to 2d as the address data AL[5–9, 11–12].

Further, in the case of FIG. 4 and the like, the clock-input buffer section 7 generates the internal clock signal ICLK corresponding to the external clock signal ECLK to output into the first address-latch circuit section 4 and the address-latch circuits 5a, 5b. The first address-latch circuit section 4 and the address-latch circuits 5a, 5b perform latch operation depending on the internal clock signal ICLK.

Although the present invention has been described in detail in the preferred embodiment, it will be apparent to those skilled in the art that the present invention is not limited to that, and various changes and modifications are possible within the art of the present invention as defined by the following claims.

What is claimed is:

1. A semiconductor memory device comprising:

a memory section that is composed of a plurality of memory banks, an address-input buffer section that generates and outputs an internal address signal corresponding to an external address signal, which is an address signal input from the outside, a first address-latch circuit section that latches data indicative of a desired memory bank contained in the internal address signal output from said address-input buffer section to output to each memory bank of said memory section, and a second address-latch circuit section that latches data indicative of a cell address contained in the internal address signal output from said address-input buffer section to output to each memory bank of said memory section, said second address-latch circuit being arranged at a neighborhood of said address-input buffer sections, wherein said first address-latch circuit section further latches data that is used for generating commands for performing the operation control of each memory bank of said memory section, and outputs the latched address data into each memory bank of said memory section, wherein said first address-latch circuit section is arranged at a central part of a memory chip of said semiconductor memory device.

2. The semiconductor memory device according to claim 1, wherein said address-input buffer section and said first and second address-latch circuit section are arranged so that a distance between the central part of the memory chip and a position at which said address-input buffer section and said second address-latch circuit are arranged is larger than a distance between the central part of the memory chip and a position at which said first address-latch circuit section is arranged.

3. The semiconductor memory device according to claim 1, wherein said address-input buffer section connected to said second address-latch circuit section is arranged apart from the central part of said memory chip so as to be divided into a plurality of address-input buffers, and wherein said second address-latch circuit section is composed of a plurality of address-latch circuits respectively built corresponding to the address-input buffers, and each address-latch circuit is arranged at a neighborhood of the corresponding address-input buffer.

4. The semiconductor memory device according to claim 3, wherein each address-input buffer generates and outputs address data, which is part of an internal address signal, depending on the corresponding address data in the input external address signal, and each address-latch circuit latches predetermined address data in the input address signal output from the corresponding address-input buffer and outputs into each memory bank in said memory section.

5. The semiconductor memory device according to claim 4, wherein each address-input buffer is arranged at a terminal part of a memory chip.

* * * * *